INVENTORS
HOMER E. STEPHENSON
ROBERT E. PACE
BY Jack M. Wiseman
ATTORNEY

INVENTORS
HOMER E. STEPHENSON
ROBERT E. PACE
BY
Jack M. Wiseman
ATTORNEY

INVENTORS
HOMER E. STEPENSON
ROBERT E. PACE
BY Jack M. Wiseman
ATTORNEY 3,363,115

INTEGRAL COUNTING CIRCUIT WITH STORAGE CAPACITORS IN THE CONDUCTIVE PATH OF STEERING GATE CIRCUITS

Homer E. Stephenson and Robert E. Pace, Sunnyvale, Calif., assignors to General Micro-Electronics Inc., Santa Clara, Calif., a corporation of Delaware Filed Mar. 29, 1965, Ser. No. 443,445
11 Claims. (Cl. 307—279)

ABSTRACT OF THE DISCLOSURE

The counter circuit of the present invention comprises a pair of semiconductor field-effect devices interconnected to form a flip-flop circuit. Steering gate circuits sense the state of the flip-flop circuits. Each steering gate circuit includes a series-connected storage capacitor and a field-effect device. Switching circuits cause the flip-flop circuit to change its state from the one sensed by the steering gate circuits. Each switching circuit includes a field-effect semiconductor device and, in addition thereto, a field-effect device in common to both switching circuits and in series with the field-effect semi-conductor devices of the respective switching circuits. During switching periods, a charge on one of the storage capacitors will enable an associated switching circuit so that the flip-flop will switch its state.

The present invention relates in general to counter circuits, and more particularly to a counter circuit employing semiconductor devices.

An object of the present invention is to provide a counter circuit employing semiconductor devices that is economical to manufacture without sacrificing performance or durability.

Another object of the present invention is to provide a counter circuit employing semiconductor devices that reduces the number of power consuming nodes in each stage thereof.

Another object of the present invention is to provide a counter circuit employing semiconductor devices that has improved speed to power ratio.

Another object of the present invention is to provide a counter circuit employing semiconductor devices that enables the cascaded stages thereof to be preset to any desired state.

Another object of the present invention is to provide a counter circuit employing semiconductor devices in which the stages thereof are cascaded with facility.

Another object of the present invention is to provide a counter circuit employing semiconductor devices wherein minimum silicon area is required and wherein the number of semiconductor devices per stage is reduced to facilitate the forming of an integral circuit.

Another object of the present invention is to provide a counter circuit employing semiconductor devices which can be preset with a passive device.

Other and further objects and advantages of the present invention will be apparent to one skilled in the art from the following description taken in conjunction with the accompanying drawings, in which.

Figure 3A:
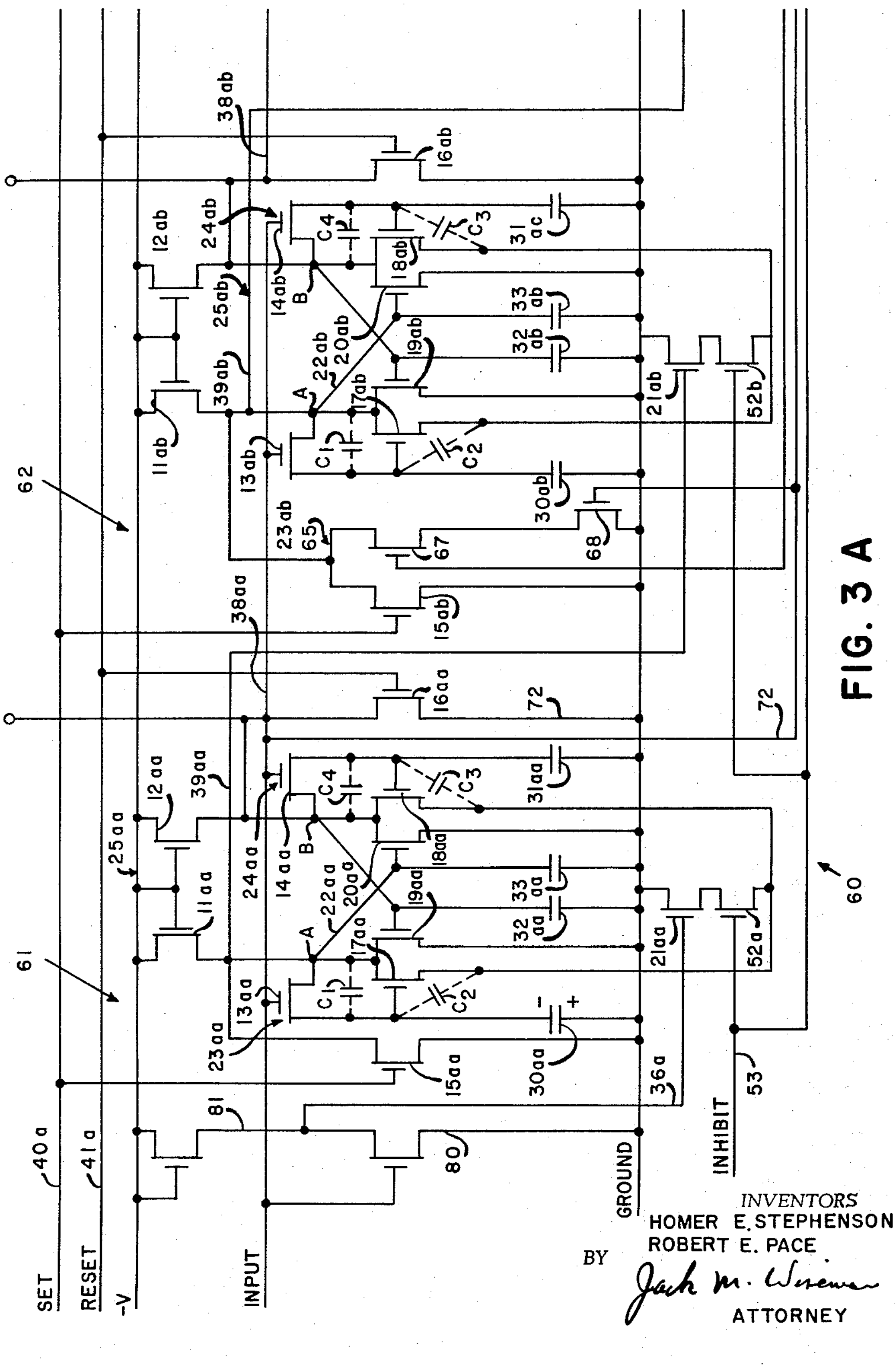
Figure 3B:
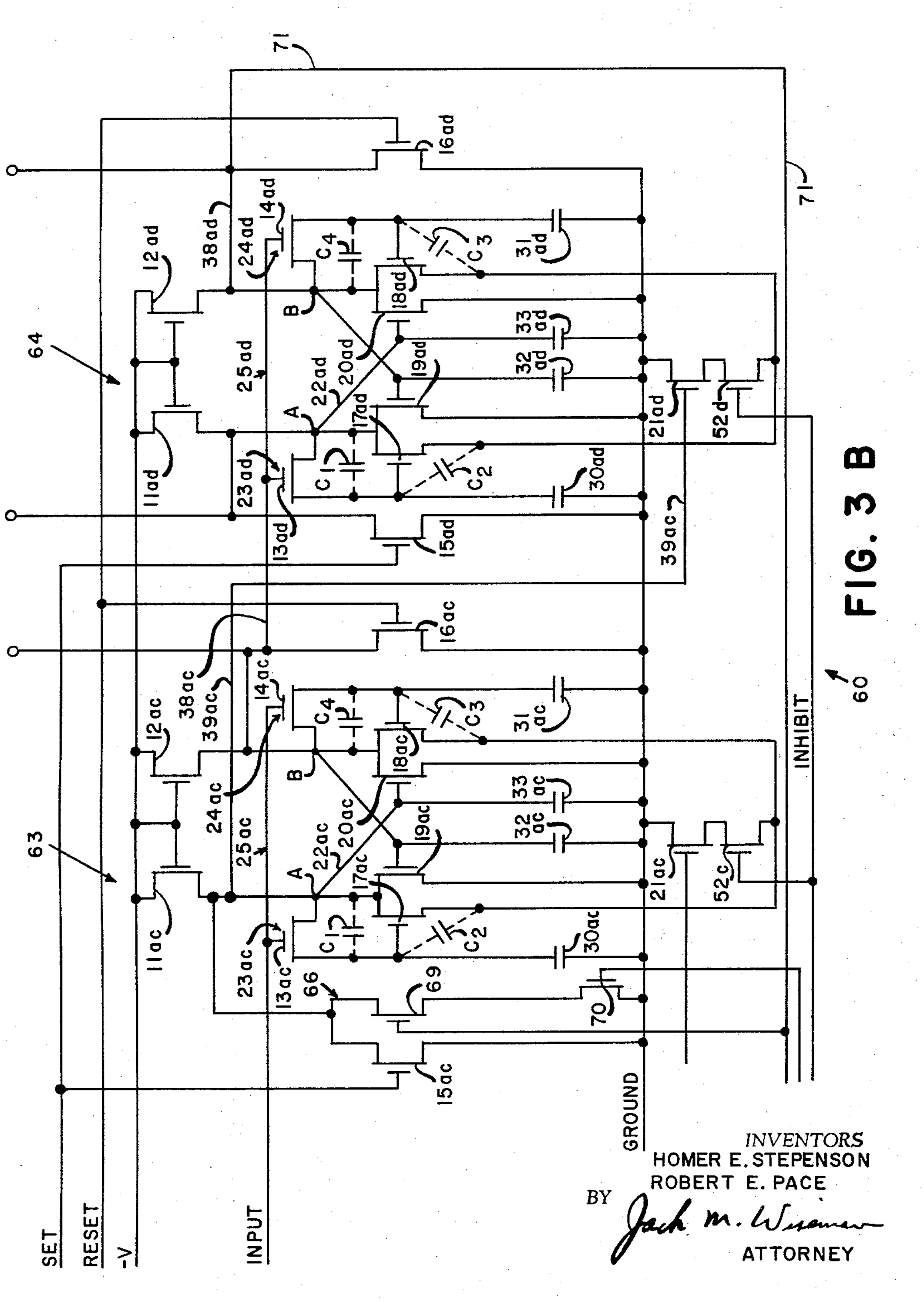

FIGS. 3A and 3B when placed end-to-end with FIG. 3B to the right of FIG. 3A are a schematic diagram of the counter circuit of the present invention.

Figure 1:
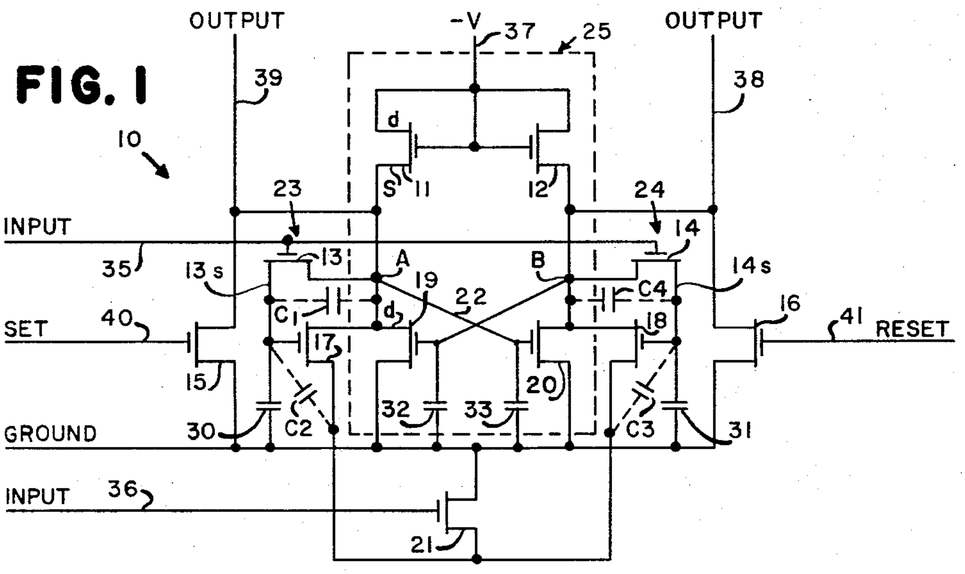
FIG. 1 is a schematic diagram of a counting flip-flop circuit embodied in the present invention.

Illustrated in FIG. 1 is the integral counting flip-flop circuit 10 of the present invention, which comprises wellknown metal oxide semiconductor field-effect devices 11-21. In accordance with the present invention, the integral counting flip-flop circuit 10 is formed in a monolithic semiconductor body or wafer. The semiconductor devices 11, 12, 19 and 20 are interconnected by a network 22 to form a direct coupled flip-flop circuit 25. Serving as resistive load elements for the semiconductor devices 19 and 20, respectively, and connected to the respective drain electrodes thereof are the semiconductor devices 11 and 12.

Steering gates 23 and 24, which sense the state of the direct coupled flip-flop circuit 25, include respectively the semiconductor devices 13 and 14. The semiconductor devices 17, 18 and 21 provide a switching path or circuit to cause the direct coupled flip-flop circuit 25 to change its state from the one sensed by the steering gates 23 and 24. A synchronous set and reset are accomplished by semiconductor devices 15 and 16, respectively.

Inherent in the characteristics of insulated gate metal oxide semiconductor field-effect devices are interelectrode capacitances, which are represented in the present circuit by reference numerals C1–C4. The effect of the interelectrode capacitances C1–C4 is influenced by capacitors 30–33, which are formed in the integral counting flip-flop circuit 10. The capacitor 30, however, provides switching storage for the switching path including the semiconductor devices 17 and 21, and the capacitor 31 also provides switching storage for the switching path including the semiconductor devices 18 and 21. The capacitors 30 and 31, which are temporary storage capacitors for holding the semiconductor devices 17 and 18, respectively, in their present state during switching functions, are connected to the gate electrodes of the semiconductor devices 17 and 18, respectively, and are in the conductive paths of the steering gate semiconductor devices 13 and 14, respectively.

An input conductor 35 is connected to the gate electrodes of the semiconductor devices 13 and 14 in the steering gate circuits 23 and 24, respectively. An inverted input conductor 36 is connected to the gate electrode of the semiconductor device 21. A negative drain potential is applied to the semiconductor devices 11 and 12 over a conductor 37. An output signal is taken off a conductor 38 and an inverted output signal is taken off a conductor 39. Set potential is applied to the gate electrode of the semiconductor device 15 over a conductor 40 and a reset potential is applied to the gate electrode of the semiconductor 16 over a conductor 41.

The following initial conditions are assumed: the input conductor 35 is negative; a logic zero or ground potential is applied to the inverted input conductor 36; the semiconductor device 19 is off, and the semiconductor device 20 is on.

Under the foregoing conditions, the semiconductor device 21 is off and the semiconductor devices 13 and 14 of the steering gate circuits 23 and 24, respectively, are enabled. The capacitance 30 is charged negatively with respect to ground over a path including the semiconductor device 11, semiconductor device 13, capacitor 30 and ground. Consequently, the semiconductor device 17 is enabled.

The capacitor 31 is discharged to near ground potential over a path including the semiconductor device 12, semiconductor device 14, capacitor 31 and ground. As previously mentioned, the semiconductor device 20 is on and the semiconductor device 19 is off and the semiconductor device 18 is in the off or disabled condition. The capacitance C2 will be charged negatively to a voltage equal to the gate to source threshold voltage of the semiconductor device 17. The negative charge on the capacitance C2 will always be of a voltage less than the voltage across the capacitor 30. Although the semiconductor device 17 is in enabled condition, it cannot conduct because the semiconductor device 21 is in the off condition.

When the input potential applied to the conductor 35 goes toward zero volts and the inverted input potential applied to the conductor 36 goes negative, the semiconductor device 13 is disabled immediately. The potential charge across the capacitors 30 and 31 is trapped, thereby holding the semiconductor device 17 in the on condition and the semiconductor device 18 in the off condition.

The inverted input potential applied to the conductor 36 goes negative to turn on the semiconductor device 21, thereby completing a switching conduction path or circuit from ground, semiconductor device 21, semiconductor device 17 and semiconductor device 11. This action causes the junction A to go to near ground potential, and the semiconductor device 20 is now turned off. Junction A is at the same potential as the gate of the semiconductor device 20. The flip-flop action of the circuit 22 causes the semiconductor device 19 to turn on, thus holding the direct coupled flip-flop circuit 25 in a state opposite from its initial state. The semiconductor device 11 serves as a resistive load element for the conducting semiconductor device 19 and an inverted logic one (ground voltage) is transmitted over the output conductor 39.

When the semiconductor device 21 turns on, the side of the capacitance C2 associated with the semiconductor device 17 is switched to near ground potential which places the capacitance C2 in parallel with the capacitor 30. Thereupon, voltage across the capacitor 30 is transferred to the capacitance C2, which reduces the potential charge on the capacitor 30. The ratio of the capacitance of the capacitor 30 with respect to the capacitance C2 must be sufficiently large to prevent voltage reduction across the capacitor 30 to such an extent as to cause the semiconductor device 17 to turn off. It has been determined that a ratio equal to or greater than 5 to 1 is sufficient. Hence, the negative charge on the capacitor 30 holds the semiconductor device 17 on during switching transient time.

During the switching action, when the semiconductor device 21 is turned on, the capacitance C1 tends to cause undesirable feedback. To obviate this condition, the ratio of the capacitance of the capacitor 30 with respect to the capacitance C1 should be maintained high. For this purpose, a ratio of 10 to 1 is considered to be adequate.

When the input potential applied to the conductor 35 returns to the negative pulse potential and the potential applied to the conductor 36 returns to zero, the semiconductor device 21 is turned off, the semiconductor device 17 is turned off and the semiconductor devices 13 and 14 are enabled. As previously described, the semiconductor device 19 is on and the semiconductor device 20 is off.

The capacitor 31 charges negatively with respect to ground over a path including the semiconductor 12, semiconductor device 14, capacitor 31 and ground. Consequently, the semiconductor device 18 is enabled.

Thereupon, the capacitor 30 discharges to near ground potential over a path including the semiconductor 11, semiconductor device 13, capacitor 30 and ground. As previously mentioned, the semiconductor device 19 is on and the semiconductor device 20 if off. As a consequence of the capacitor 30 discharging to near ground potential, the semiconductor device 17 is in the off condition. The capacitance C4 will now charge negatively to a voltage equal to the gate to source threshold voltage of the semiconductor 18. The negative charge of the capacitance C4 will always be of a voltage less than the voltage across the capacitor 31. Although the semiconductor device 18 is in the enabled condition, it cannot conduct, because the semiconductor device 21 is in the off condition.

When the input potential applied to the conductor 35 again goes toward zero volts and the inverted input potential applied to the conductor 36 goes negative, the semiconductor device 31 and 30 is trapped, thereby holding the semiconductor device 18 in the on condition.

The inverted input potential applied to the conductor 36 turns on the semiconductor device 21, thereby completing a switching path from ground, semiconductor device 21, semiconductor device 18 and the semiconductor device 12. This action causes the junction B to go near ground potential, and the semiconductor device 19 is now turned off. The junction B is at the same potential as the gate of the semiconductor device 19. The flip-flop action of the circuit 22 causes the semiconductor device 20 to turn on, thus holding the direct coupled flip-flop circuit 25 in its initial state. The semiconductor device 12 serves as a resistive load element for the conducting semiconductor device 20 and a logic one condition is transmitted over the output conductor 38.

When the semiconductor device 21 turns on, the side of the capacitance C3 associated with the semiconductor device 18 is switched to near ground potential, which places the capacitance C3 in parallel with the capacitor 31. Thereupon, voltage across the capacitor 31 is transferred to the capacitance C3, which reduces the potential charge on the capacitor 31. The ratio of the capacitance of the capacitor 31 with respect to the capacitance C3 must be sufficiently large to prevent voltage reduction across the capacitor 31 to such an extent as to cause the semiconductor device 18 to turn off. Thus, the negative charge on the capacitor 31 holds the semiconductor device 18 on during switching transient time. It has been determined that a ratio equal to or greater than 5 to 1 is sufficient.

During the switching action, when the semiconductor device 21 is turned on, the capacitance C4 tends to cause undesirable feedback. To obviate this condition, the ratio of the capacitance of the capacitor 31 with respect to the capacitance C4 should be maintained high. For this purpose, the ratio of 10 to 1 is considered to be adequate.

When the input potential applied to the conductor 35 returns to the negative pulse potential and the potential applied to the conductor 36 returns to zero, the semiconductor device 21 is turned off, the semiconductor device 18 is turned off and the semiconductor devices 13 and 14 are enabled.

The capacitors 32 and 33 are provided to aid in charging capacitors 31 and 30 at the time the semiconductor devices 13 and 14 are enabled by the negative going input pulse applied to the input conductor 35. The dynamic resistance of the semiconductor devices 13 and 14 is made relatively large by controlling the geometry of the silicon wafer. A capacitance ratio of 3 to 1 for the capacitor 30 relative to the capacitor 33 and the capacitor 31 relative to the capacitor 32 and a dynamic resistance in the order of 25,000 ohms for the semiconductor devices 13 and 14 assure a reliable operation.

Figure 2:
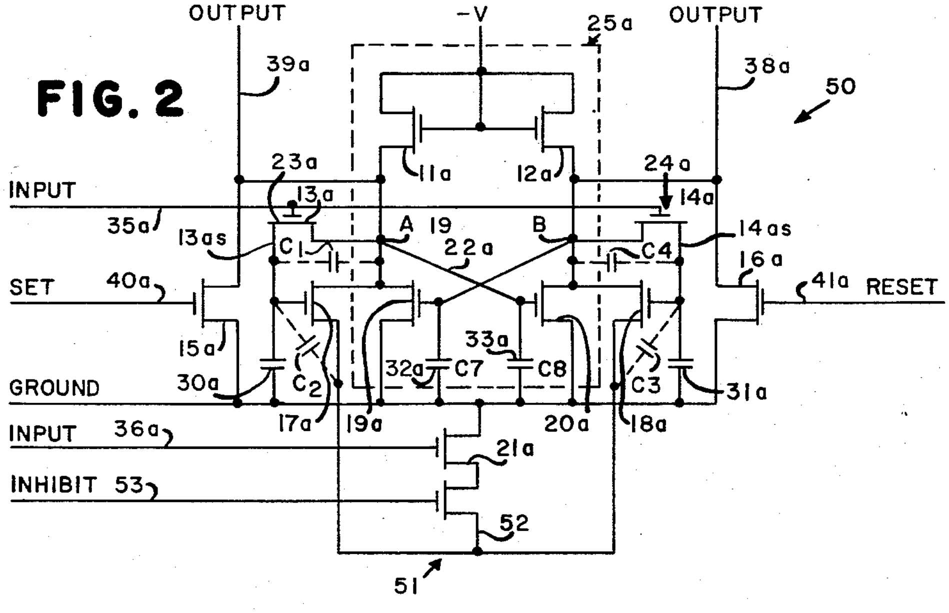
FIG. 2 is a schematic diagram of the counting flip-flop circuit illustrated in FIG. 1 with an inhibiting circuit.

Illustrated in FIG. 2 is a counting flip-flop circuit 50, which is similar to the counting flip-flop circuit 10 shown in FIG. 1 with, however, the addition of an inhibiting circuit 51. Therefore, elements of the circuit 50 (FIG. 2) that correspond with the elements of the circuit 10 (FIG. 1) are identified with the same reference numerals accompanied by the suffix "*a*." Like elements, components, or parts are structurally similar and operate in a similar manner.

The counting flip-flop circuit 50 has been integrated on a single monolithic silicon chip. The inhibiting circuit 51 comprises a metal oxide semiconductor field-effect device 52, which has its source electrode connected in series with the drain electrode of the semiconductor device 21*a*. The gate electrode of the semiconductor device 52 is connected to an inhibit conductor 53 for receiving signals thereover. The drain electrode of the semiconductor device 52 is connected to the source electrodes of the semiconductor devices 17a and 18a.

When a ground potential is applied to the inhibit conductor 53, the gate electrode on the semiconductor device 52 is held at ground. Hence, the semiconductor device 52 will remain in the off condition. Consequently, the counting flip-flop circuit 50 will maintain its existing state regardless of the signals impressed on the input conductors 35a and 36a.

Through the inhibit circuit 52 being at ground potential by way of the gate electrode thereof and the conductor 53, the counting flip-flop circuit 50 is effectively isolated from its input signal over the input conductor 35a and the inverted input conductor 36a, since the semiconductor device 52 will remain off regardless of the signals applied over the conductors 35a and 36a.

By employing the inhibiting circuit 52, the counting flip-flop circuits 50 can be cascaded into a counter circuit in which each counting flip-flop circuit 51 thereof can be preset to any desired state. Thus, under the foregoing arrangement, the changing of the state of one counting flip-flop circuit will affect the state of the succeeding counting flip-flop circuit only when such succeeding counting flip-flop circuit does not have the inhibiting conductor thereof grounded.

For presetting the counting flip-flop circuit 51, a negative potential is first applied to the set conductor 40a. This action causes the semiconductor device 15a to be on, which in turn causes the potential at junction A to go near ground potential and the semiconductor 20a to be off. Hence, the semiconductor device 19a is on. Optionally, the output conductor 38a could be grounded or not be grounded for presetting.

If the output conductor 38a is at ground, then the flip-flop circuit 25 is in a zero state. On the other hand, if the output conductor 38a is not at ground, then the flip-flop circuit 25 is in a logic one state. By selectively grounding the output of the cascaded flip-flop circuits 25a any preselected number can be established.

In resetting the counting flip-flop circuit 51, a negative potential is first applied to the reset conductor 41a. This action causes the semiconductor device 16a to be on, which in turn causes the potential at junction B to go near ground potential and semiconductor device 19a is off. Hence, the semiconductor 20a is on.

Illustrated in FIGS. 3A and 3B is a counting circuit 60, which employs the counting flip-flop circuit 50 shown in FIG. 2. The counting circuit 60 as illustrated comprises four stages, namely: stages 61–64 connected in cascade and integrated on a single monolithic chip. In the preferred embodiment, the counting circuit 60 includes nine stages repetitive of the illustrated stages connected in cascade and integrated on a single monolithic silicon chip.

The stages 61 and 64 are counting flip-flop circuits and are similar in construction and operate in the manner described for the counting flip-flop circuit 50. Therefore, the reference numerals for like parts for the counting flip-flop circuit 61 will bear the additional suffix *a* and reference numerals for like parts for the counting flip-flop circuit 64 will bear the additional suffix *d*. Stages 62 and 63 are also counting flip-flop circuits and are similar in construction and operation to the counting flip-flop circuit 50. However, the counting flip-flop circuits 62 and 63 include two input nand gate circuits 65 and 66, respectively. The nand gate circuit 65 includes metal oxide semiconductor field-effect devices 67 and 68, and the nand gate circuit 66 includes metal oxide semiconductor field-effect devices 69 and 70. The reference numerals for the remaining parts for the counting circuit 62 will bear the suffix "*b*" for parts that correspond with the parts of the circuit 50. In a like manner, the reference numerals for the remaining parts for the counting circuit 63 will bear the suffix "*c*."

The semiconductor device 11ab serves as the load resistor for the nand gate circuit 65 and the semiconductor device 11ac serves as a resistive load element for the nand gate circuit 66. The inputs of the nand gate circuits 65 and 66 are supplied from the counting flip-flop circuits 61 and 64 over conductors 71 and 72. The effect thereof is to cause stages 61–64 to act as a decade counter, i.e., divide by 10 rather than 16 as would be the case were the devices 67–70 omitted. A nine stage circuit would provide one output cycle for each 200 cycles supplied to the input.

All stages may be simultaneously set to the logical zero condition or to the logical one (negative voltage) condition by the application of a negative voltage to the reset conductor 41a or the set conductor 40a, respectively. After the application of a set pulse and with the inhibiting line at ground, each counting flip-flop circuit 61–64 may be independently set to the logical zero condition by simply grounding the output line associated with the particular counting flip-flop circuit.

The counting flip-flop stages 50 may be cascaded in a counter configuration in the above described manner with as many stages as may be desired. The stages are integrated on a single monolithic silicon chip. The input conductor 35a is also connected to an inverting metal oxide semiconductor field-effect device 80. A resistive load element for the semiconductor device 80 is provided by the metal oxide semiconductor field-effect device 81. The semiconductor device 80 is connected to the switching semiconductor device 21aa to transmit thereto an inverted input signal.

In the operation of the counting circuit 60, the counting flip-flop circuits 61–64 are initially in a zero state. Hence, the semiconductor devices 19aa–19ad are in an off condition and the semiconductor devices 20aa–20ad are in an on condition. When an input cycle signal is first supplied to the input conductor 35a, the potential applied to the gate electrodes of the steering gate semiconductor devices 13aa and 14aa goes toward zero volts and the inverted input potential applied to the conductor 36a for application to the semiconductor device 21aa goes negative, the state of the counting flip-flop circuit 61 is in a logical one condition and the remaining counting flip-flop circuits 62–64 remain in the initial zero state. Hence, the semiconductor device 19aa is in an on condition and the semiconductor device 20a is in an off condition. The foregoing occurs in a manner previously described in detail in connection with the counting flip-flop circuit 10.

Upon the application of the succeeding input cycle signal on the conductor 35a, the counting flip-flop circuit 61 returned to its initial zero state with the semiconductor device 20a returning to the on condition. Hence, a potential is applied over the output conductor 38aa to the succeeding counting flip-flop circuit 62 which is transmitted to the gate electrodes of the semiconductor devices 13ab and 14ab of the steering circuits 23ab and 24ab, respectively. As the potential so applied goes toward zero volts and the inverted input signal over the conductor 39aa to the switching semiconductor device 21ab goes negative, the counting flip-flop circuit 62 changes its state in a manner described in detail for the operation of the counting flip-flop circuit 10 of FIG. 1.

Thus, the semiconductor device 19ab of the counting flip-flop circuit 62 is in the logical one state and the semiconductor device 20ab is in the logical zero state. The flip-flop counting circuits 63 and 64 remain in the logical zero state. At this time, the counting flip-flop circuits 61, 63 and 64 are in a zero state and the counting flip-flop circuit 62 is in a logical one state. The output conductor 38aa therefore transmits thereover a cycling signal to the succeeding flip-flop circuit 62 for every two input cycling signals received by the flip-flop circuit 61, which produces the signal transmitted over the output conductor 38a.

The succeeding or third application of an input cycle signal on the conductor 35a renders the counting flip-flop circuit 61 operating in the logical one state, the counting flip-flop circuit 62 remains in the logical one state, and the counting flip-flop circuit 63 remains in the logical zero state. The counting flip-flop circuit 64 also remains at the logical zero state.

When the next or fourth application of an input cycle signal is transmitted over the conductor 35*a*, the counting flip-flop circuit 61 goes to the logical zero state, the counting flip-flop circuit 62 now goes to the logical zero state, the counting flip-flop circuit 63 now goes to the logical one state and the counting flip-flop circuit 64 remains at the logical zero state.

Upon the application of the fifth input cycling signal over the conductor 35*a* the counting flip-flop circuit 61 goes to the logical one state, the counting flip-flop circuit 62 remains in the zero state, the counting flip-flop circuit 63 remains in the logical one state and the counting flip-flop circuit 64 remains at the logical zero state.

The transmission of the sixth input cycling signal over the input conductor 35*a* returns the counting flip-flop circuit 61 to its zero state and the counting flip-flop circuit 62 goes to the logical one state. The counting flip-flop circuit 63 remains in the logical one state and the counting flip-flop circuit 64 remains in the logical zero state.

By applying the seventh input cycling signal to the counting flip-flop stage 61, the counting flip-flop circuit 61 goes to the logical one state, the counting flip-flop circuits 62 and 63 remain in the logical one stage and the counting flip-flop circuit 64 remains in the logical zero state.

When the eighth input cycling signal is fed to the counting flip-flop circuit 61, the counting flip-flop circuits 61–63 return to their logical zero state. Now, the counting flip-flop circuit 64 goes to a logical one state.

Thus, the counting flip-flop circuit 61 changes its logical state each time an input cycling signal is transmitted thereto over the input conductor 35*a*. In turn, the counting flip-flop circuit 62 changes its state each time the counting flip-flop circuit 61 returns to its zero state or stated otherwise the counting flip-flop circuit 62 changes its state once for every two input cycling signals transmitted over the input conductor 35*a* to the counting flip-flop circuit 61.

On the other hand, the counting flip-flop circuit 63 changes its logical state once for every four cycling input signals fed to the counting flip-flop circuit 61 over the input conductor 35*a*. Thus, the counting flip-flop circuit 63 changes its state each time the counting flip-flop circuit 62 returns to its zero state to produce a cycling signal over the conductor 38*ab* to the counting flip-flop circuit 63.

In a like manner, the counting flip-flop circuit 64 changes its logical state once for every eight cycling input signals transmitted to the counting flip-flop circuit 61 over the input conductor 35*a*. Hence, the counting flip-flop circuit 64 changes its state each time the counting flip-flop circuit 63 returns to its zero state to produce a cycling signal over the conductor 38*ac* to the counting flip-flop circuit 63.

In a binary system, the above continues and after sixteen input cycling systems transmitted over the conductor 35*a* to the counting flip-flop circuit 61, the counting flip-flop circuits 61–64 are in a logical one state.

However, the preferred embodiment of the present invention includes the nand gate circuits 65 and 66 in the counting flip-flop circuits 62 and 63, respectively.

Upon the application of the eighth input cycling signal over the conductor 35*a*, the counting flip-flop circuit 64 changes its state to the logical one state. Thereupon, a cycling signal is transmitted over the conductor 71 to the nand gate circuits 65 and 66 in the counting circuits 62 and 63, respectively, to turn on the semiconductor devices 67 and 69 to prepare the nand gate circuits 65 and 66. The nand gate circuits 65 and 66 are two input gate circuits.

After the ninth input cycling signal over the conductor 35*a* is applied to the counting flip-flop circuit 61 or the tenth input cycling signal when considering the digit one as the initial all zero state, the counting flip-flop circuit 61 goes to a one state and the counting flip-flop circuit 64 remains in the one state. At this time, the counting flip-flop circuits 62 and 63 remain in their zero logical state. The change of state by the counting flip-flop circuit 61 to the logical one state causes a cycling signal to be transmitted over the conductor 72 to the nand gate circuits 65 and 66 to turn on the semiconductor devices 68 and 70, thereby causing the nand gate circuits 65 and 66 to change their state. As a consequence thereof, the potential applied to junction A of the counting flip-flop circuits 62 and 63 changes the state thereof to the logical one state. Accordingly, the counting flip-flop circuits 61–64 are temporarily or in a transient nature in the logical one state.

The counting circuit 60 can continue its operation and repeat the foregoing sequence. In the alternative, a negative pulse applied to the conductor 41*a* resets all counting flip-flop circuits to the initial logical zero state.

It is to be understood that modifications and variations of the embodiments of the invention disclosed herein may be resorted to without departing from the spirit of the invention and the scope of the appended claims.

Having thus described our invention, what we claim as new and desire to protect by Letters Patent is:

1. In combination, a first and a second field-effect semiconductor device, said first and second semiconductor devices each having a gate electrode, means interconnecting said first and second field-effect devices to form a flip-flop circuit, a first switching circuit connected to the gate electrode of said first semiconductor device for controlling the potential thereon to regulate the state thereof, said first switching circuit comprising a plurality of serially connected field-effect semiconductor devices, and a second switching circuit connected to the gate of electrode of said second semiconductor device for controlling the potential thereon to regulate the state thereof, said second switching circuit comprising a field-effect semiconductor device connected in series with one of said field-effect semiconductor devices of said first switching circuit to form a common switching path therewith.

2. In combination, a first and a second semiconductor device, means interconnecting said first and second semiconductor devices to form a flip-flop circuit, a first switching circuit connected to said first semiconductor device for controlling the potential thereon to regulate the state thereof, said first switching circuit comprising a plurality of serially connected field-effect semiconductor devices, each of said field-effect semiconductor devices in said first switching circuit including a gate electrode, a first storage capacitor connected to the gate electrode of one of said field-effect semiconductor devices of said first switching circuit for controlling the potential thereon to regulate the state thereof, a second switching circuit connected to said second semiconducor device for controlling the potential thereon to regulate the state thereof, said second switching circuit comprising a field-effect semiconductor device connected in series with another field-effect semiconductor device of said first switching circuit to form a common switching path therewith, said field-effect semiconductor device of said second switching circuit including a gate electrode, a second storage capacitor connected to the gate electrode of said field-effect semiconductor device of said switching circuit for controlling the potential thereon to regulate the state thereof, and means for impressing a signal on the gate electrode of said another field-effect semiconductor device in said common switching path.

3. In combination, a first and a second field-effect semiconductor device, each of said first and second field-effect semiconductor devices including a gate electrode, means interconnecting said first and second field-effect semiconductor devices to form a flip-flop circuit, a first switching circuit connected to the gate of said first field-effect semiconductor device for controlling the potential thereon to regulate the state thereof, said first switching circuit comprising a plurality of serially connected semiconductor field-effect devices, each of said serially connected semiconductor field-effect devices including a gate electrode, a first storage capacitor connected to the gate electrode of one of said semiconductor field-effect devices of said first switching circuit for controlling the potential thereon to regulate the state thereof, a second switching circuit connected to the gate electrode of said second field-effect semiconductor device for controlling the potential thereon to regulate the state thereof, said second switching circuit comprising a semiconductor field-effect device connected in series with another semiconductor field-effect device of said first switching circuit to form a common switching path therewith, said semiconductor field-effect device of said second switching circuit including a gate electrode, a second storage capacitor connected to the gate electrode of said semiconductor field-effect device of said second switching circuit for controlling the potential thereon to regulate the state thereof, and means for impressing a signal on the gate electrode of said another semiconductor field-effect device in said common switching path for controlling the conduction thereof.

4. In combination, a first and a second semiconductor device, means interconnecting said first and second semiconductor devices to form a flip-flop circuit, a first switching circuit connected to said first semiconductor device for controlling the potential thereon to regulate the state thereof, said first switching circuit comprising a field-effect device with a gate electrode, a first storage capacitor connected to the gate electrode of said field-effect semiconductor device of said first switching circuit for controlling the potential thereon to regulate the state thereof, a second swiching circuit connected to said semiconductor device for controlling the potential thereon to regulate the state thereof, said second switching circuit comprising a field-effect semiconductor device with a gate electrode, a second storage capacitor connected to the gate electrode of said field-effect semiconductor device of said second switching circuit for controlling the potential thereon to regulate the state thereof, means for impressing a control signal on said first and second switching circuits, and steering gate means connected to said first and second semiconductor devices for sensing the state thereof and connected to said storage capacitors to control the potential thereon for regulating the state of said field-effect semiconductor device of said first switching circuit and to regulate the state of said field-effect semiconductor device of said second switching circuit.

5. In combination, a first and a second semiconductor device, means interconnecting said first and second semiconductor devices to form a flip-flop circuit, a first switching circuit connected to said first semiconductor device for controlling the potential thereon to regulate the state thereof, said first switching circuit comprising a semiconductor field-effect device with a gate electrode, a first storage capacitor connected to the gate electrode of said semiconductor field-effect device of said first switching circuit for controlling the potential thereon to regulate the state thereof, a second switching circuit connected to said second semiconductor device for controlling the potential thereon to regulate the state thereof, said second switching circuit comprising a semiconductor field-effect device with a gate electrode, a second storage capacitor connected to the gate electrode of said semiconductor field-effect device of said second switching circuit for controlling the potential thereon to regulate the state thereof, means for impressing a control signal on said first and second switching circuits, and steering gate means connected to said first and second semiconductor devices for sensing the state thereof and connected to said storage capacitors to control the potential thereon for regulating the state of said semiconductor field-effect device of said first switching circuit and to regulate the state of said semiconductor field-effect device of said second switching circuit, said steering gate means comprising a field-effect semiconductor device in the conductive path of said first storage capacitor and a field-effect semiconductor device in the conductive path of said second storage capacitor.

6. In combination, a first and a second semiconductor device, means interconnecting said first and second semiconductor devices to form a flip-flop circuit, a first switching circuit connected to said first semiconductor device for controlling the potential thereon to regulate the state thereof, said first switching circuit comprising a plurality of serially connected field-effect devices, each of said serially connected field-effect devices including a gate electrode, a first storage capacitor connected to the gate electrodes of one of said field-effect semiconductor devices of said first switching circuit for controlling the potential thereon to regulate the state thereof, a second swiching circuit connected to said second semiconductor device for controlling the potential thereon to regulate the state thereof, said second switching circuit comprising a field-effect semiconductor device connected in series with another field-effect device of said first switching circuit to form a common switching path therewith, said field-effect semiconductor device of said second switching circuit including a gate electrode, a second storage capacitor connected to the gate electrodes of said field-effect semiconductor device of said second switching circuit for controlling the potential thereon to regulate the state thereof, means for impressing a signal on the gate electrodes of said another field-effect semiconductor device in said common path, a first steering gate circuit connected to said first and second semiconductor devices for sensing the state thereof and connected to said first storage capacitor to control the potential thereon for regulating the state of said one field-effect semiconductor device of said first switching circuit, said first steering gate circuit comprising a field-effect semiconductor device in the conductive path of said first storage capacitor, said field-effect semiconductor device in said first steering gate including a gate electrode, a second steering gate circuit connected to said first and second semiconductor devices for sensing the state thereof and connected to said second storage capacitor to control the potential thereon for regulating the state of said field-effect semiconductor device of said second switching circuit, said second steering gate circuit comprising a field-effect semiconductor device in the conductive path of said second storage capacitor, said field-effect semiconductor device in said second steering gate circuit including a gate electrode, and means for impressing a signal on the gate electrodes of said semiconductor devices in said first and second steering gate circuits.

7. In combination, a first and a second semiconductor device, means interconnecting said first and second semiconductor devices to form a flip-flop circuit, a first switching circuit connected to said first semiconductor device for controlling the potential thereon to regulate the state thereof, said first switching circuit comprising a semiconductor field-effect device with a gate electrode, a first storage capacitor connected to the gate electrode of semiconductor field-effect device of said first switching circuit for controlling the potential thereon to regulate the state thereof, a second switching circuit connected to said second semiconductor device for controlling the potential thereon to regulate the state thereof, said second switching circuit comprising a semiconductor field-effect device with a gate electrode, a second storage capacitor connected to the gate electrode of said semiconductor field-effect device of said second switching circuit for controlling the potential thereon to regulate the state thereof, means for impressing a control signal on said first and second switching circuits, a first steering gate circuit connected to said first and second semiconductor devices for sensing the state thereof and connected to said first storage capacitor to control the potential thereon for regulating the state of said semiconductor field-effect device of said first switching circuit, said first steering gate comprising a field-effect semiconductor device in the conductive path of said first storage capacitor, said field-effect semiconductor device in said first steering gate including a gate electrode, a second steering gate circuit connected to said first and second semiconductor devices for sensing the state thereof and connected to said second storage capacitor to control the potential thereon for regulating the state of said semiconductor field-effect device of said second switching circuit, said second steering gate circuit comprising a field-effect semiconductor device in the conductive path of said second storage capacitor, said field-effect semiconductor device in said second steering gate circuit including a gate electrode, and means for impressing a signal on the gate electrodes of said semiconductor devices in said first and second steering gate circuits.

8. The combination as claimed in claim 4 and including a semiconductor device connected to the output of said first semiconductor device to form a resistive load element therefor, and a semiconductor device connected to the output of said second semiconductor device to form a resistive load element therefor.

9. The combination as claimed in claim 5 and including a semiconductor device connected to the output of said first semiconductor device of said flip-flop circuit to form a resistive load element therefor, and a semiconductor device connected to the output of said second semiconductor device of said flip-flop circuit to form a resistive load element therefor.

10. In combination, a first and a second semiconductor device, means interconnecting said first and second semiconductor devices to form a flip-flop circuit, a first switching circuit connected to said first semiconductor device for controlling the potential thereon to regulate the state thereof, said first switching circuit comprising a field-effect semiconductor device, a second switching circuit connected to said second semiconductor device for controlling the potential thereon to regulate the state thereof, said second switching circuit comprising a field-effect semiconductor device, a switching and inhibiting circuit connected in common with said first and second switching circuits and connected to said first and second semiconductor devices of said flip-flop circuit, said switching and inhibiting circuit comprising a switching field-effect semiconductor device and an inhibiting field-effect semiconductor device connected in series, said switching and said inhibiting field-effect semiconductor devices each including gate electrodes, means for impressing an input signal on the gate electrodes of said switching field-effect semiconductor device to control the potential thereon for regulating the state thereof, and means for impressing a signal on the gate electrodes of said inhibiting field-effect semiconductor device to control the potential thereon for regulating the state thereof to maintain said flip-flop circuit in its existing state.

11. A counter comprising a plurality of counting flip-flop circuits, means for connecting said counting flip-flop circuits in cascade, a switching circuit for each of said counting flip-flop circuits for changing the state of the associated counting flip-flop circuit, each of said switching circuits comprising a field-effect semiconductor device, an inhibiting circuit for each of said counting flip-flop circuits, each of said inhibiting circuits comprising a field-effect semiconductor device, means for connecting the field-effect semiconductor device of a switching circuit in series with the field-effect semiconductor device of the associated inhibiting circuit for holding the associated counting flip-flop circuit in its existing state, each said field-effect semiconductor device of each said inhibiting circuit including a gate electrode, and means for impressing signals on the gate electrode of the field-effect semiconductor device in selected inhibiting circuits for presetting the state of selected counting flip-flop circuits.

References Cited

UNITED STATES PATENTS

| | | | |
|---|---|---|---|
| 3,134,912 | 5/1964 | Evans | 307—88.5 |
| 3,170,075 | 2/1965 | Mellott | 307—88.5 |
| 3,191,061 | 6/1965 | Weimer | 307—88.5 |
| 3,252,009 | 6/1966 | Weimer | 307—88.5 |
| 3,267,295 | 8/1966 | Zuk | 307—88.5 |
| 3,292,008 | 12/1966 | Rapp | 307—88.5 |

OTHER REFERENCES

Pub. I: "Some Applications of Metal-Oxide Semiconductors to Switching Circuits" by Lohman in SCP and Solid State Technology, dated May 1964, pp. 31–34, 307–88.5/2.1.

ARTHUR GAUSS, *Primary Examiner.*

S. D. MILLER, *Assistant Examiner.*